(12) United States Patent
Tawarayama

(10) Patent No.: US 9,907,198 B2
(45) Date of Patent: Feb. 27, 2018

(54) THREE-DIMENSIONAL SUBSTRATE FOR PROVIDING THREE-DIMENSIONAL STRUCTURE

(71) Applicant: Misako Tawarayama, Tokyo (JP)

(72) Inventor: Misako Tawarayama, Tokyo (JP)

( * ) Notice: Subject to any disclaimer, the term of this patent is extended or adjusted under 35 U.S.C. 154(b) by 0 days.

(21) Appl. No.: 15/641,223

(22) Filed: Jul. 4, 2017

(65) Prior Publication Data

US 2017/0303418 A1 Oct. 19, 2017

Related U.S. Application Data

(63) Continuation of application No. PCT/JP2015/006317, filed on Dec. 18, 2015.

(30) Foreign Application Priority Data

Jan. 5, 2015 (JP) ................................. 2015-010709

(51) Int. Cl.
*H05K 7/02* (2006.01)
*H05K 5/02* (2006.01)
*H05K 7/14* (2006.01)

(52) U.S. Cl.
CPC ........... *H05K 7/023* (2013.01); *H05K 5/0247* (2013.01); *H05K 7/14* (2013.01)

(58) Field of Classification Search
USPC ....................................................... 174/560
See application file for complete search history.

(56) References Cited

U.S. PATENT DOCUMENTS

| 2005/0093751 A1* | 5/2005 | Tamaoka | H01Q 1/243 343/702 |
| 2005/0111178 A1* | 5/2005 | Bradley | G06F 1/184 361/679.38 |

(Continued)

FOREIGN PATENT DOCUMENTS

JP S57-202798 A 12/1982
JP H06-177502 A 6/1994

(Continued)

OTHER PUBLICATIONS

Interntional Search Report for PCT/JP2015/006317 dated Feb. 23, 2016.
PCT written opinion dated Feb. 23, 2016.

*Primary Examiner* — William H Mayo, III
*Assistant Examiner* — Krystal Robinson
(74) *Attorney, Agent, or Firm* — Yokoi & Co., U.S.A.; Toshiyuki Yokoi

(57) ABSTRACT

The present invention provides a three-dimensional substrate having a different shape than the conventional circuit substrate when a plurality of components are combined to form an electronic circuit. In addition, an electronic device is provided from the three-dimensional substrate. The three-dimensional substrate forms a component forming the three-dimensional structure by three-dimensionally forming the electronic circuit. The component includes at least one electronic component and an electric connection structure for electrically connecting the electronic component with the outside the component. When a plurality of components are combined, the electronic device having the three-dimensional shape having a different shape than the component is formed. The present invention provides the three-dimensional substrate capable of being designed by the shape of the substrate itself.

15 Claims, 6 Drawing Sheets

(56) References Cited

U.S. PATENT DOCUMENTS

| | | | | |
|---|---|---|---|---|
| 2005/0168961 A1* | 8/2005 | Ono | ............... | H01L 23/5385 |
| | | | | 361/784 |
| 2006/0158280 A1* | 7/2006 | Jow | ............... | H01L 23/66 |
| | | | | 333/33 |
| 2011/0188210 A1* | 8/2011 | Huang | ............... | H05K 1/14 |
| | | | | 361/735 |

FOREIGN PATENT DOCUMENTS

| JP | H10-150253 A | | 6/1998 |
|----|--------------|---|--------|
| JP | 2003-283071 A | | 10/2003 |
| JP | 2006-253506 A | | 9/2006 |
| JP | 2010-219424 A | | 9/2010 |
| JP | 2010219424 A | * | 9/2010 |
| JP | 2011-096910 A | | 5/2011 |

* cited by examiner

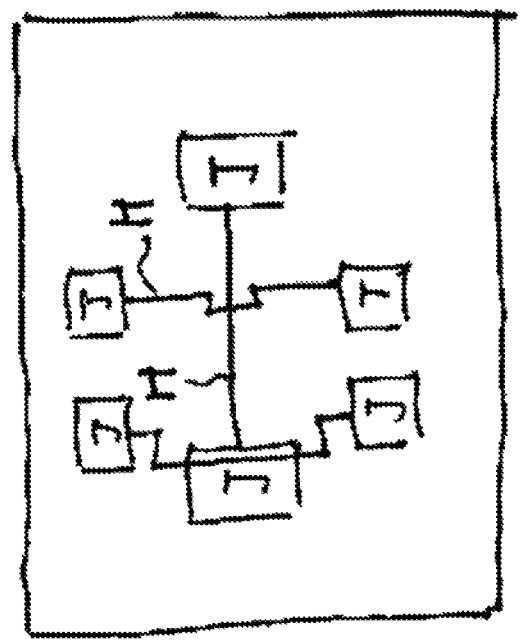

THREE-DIMENSIONAL SUBSTRATE FOR PROVIDING THREE-DIMENSIONAL STRUCTURE

CROSS-REFERENCES TO RELATED APPLICATIONS

This Application claims the benefit of priority and is a Continuation application of the prior International Patent Application No. PCT/JP2015/006317, with an international filing date of PCT/JP2015/006317, which designated the United States, and is related to the Japanese Patent Application No. 2015-010709, filed Jan. 5, 2015, the entire disclosures of all applications are expressly incorporated by reference in their entirety herein.

BACKGROUND OF THE INVENTION

1. Field of the Invention

The present invention relates to a technology to make an electronic circuit substrate three-dimensional. More specifically, the present invention relates to a three-dimensional (solid) substrate and an electronic device formed by the three-dimensional substrate so that the three-dimensional structure having a different shape than the electronic circuit substrate is formed when a plurality of components are combined to form an electronic circuit.

2. Description of Related Art

Conventionally, the substrate for forming the electronic circuit is formed in a plate-like shape. Because of the plate-like shape, flexibility of the design of home electronics or the like is limited. Furthermore, an area of the electronic circuit is limited by an area of the substrate. FIG. 14 shows a conceptual diagram of a conventional wiring substrate. In the conventional cord wiring, cords H and electronic components J are complicatedly intersected with each other. In a multilayer substrate, the cords H and electronic components J are located between the layers. Thus, a linearly circuit cannot be formed on the upper part of the electronic components J. Furthermore, although the cord wiring can be arranged vertically, laterally or obliquely in a universal substrate, the cord cannot be three-dimensionally arranged since the components are fixed on a flat surface and therefore the cord is necessarily arranged along the surface. In addition, a multilayer substrate is known as another type of the substrate. In the multilayer substrate, a plurality of circuit structures are connected with each other while they are separated with other by an insulating resin or the like. Although the multilayer is formed by overlapping the circuit structures in the multilayer substrate, the multilayer substrate merely offers the function of the substrate. The multilayer substrate cannot offer the three-dimensional structure having a different shape than the substrate.

Conventionally, the completed design of the electronic product is limited and the size of the electronic product becomes larger in many cases since the electronic circuits and other components are housed inside. Accordingly, even if the shape is same, the structure of the substrate is preferably changed for increasing an internal capacity and enabling free idea. If the wiring can be arranged more linearly and three-dimensionally crossed rather than the conventional cord wiring, the position of the components is not limited with respect to the substrate and the components can be sterically fixed. Thus, the wiring of the components can be performed using the entire space effectively. As explained above, when the electronic circuit is formed from the three-dimensional substrate, the technology for providing the three-dimensional structure different from the substrate is required.

BRIEF SUMMARY OF THE INVENTION

The present invention provides a technology of providing a three-dimensional structure having a function different from, for example, toys, furnishing goods and the other substrates by forming the circuit from the three-dimensional structure itself without using a printed substrate when the three-dimensional substrate is assembled to form the electronic circuit.

In the present invention, a space excluding the components such as lens and other materials from an internal space of the completed design of the machine is regarded as a substrate. The inventor focuses on that the circuit is formed by the wiring (cord) not by the substrate itself. If the wiring can be digitally taken in the object, the electronic circuit and the electronic device including the electronic circuit can be more flexibly provided without being limited by the shape of the substrate or the like. From the idea described above, the present invention is completed.

Namely, the present invention can provide a three-dimensional substrate for providing a three-dimensional structure by three dimensionally forming an electronic circuit, wherein the three-dimensional substrate includes at least one electronic component and an electric connection structure for electrically connecting the electronic component with a second three-dimensional substrate.

The three-dimensional substrate can be a component for providing the three-dimensional structure, and an electronic device having a different shape than the component can be formed by connecting a plurality of components. Furthermore, the three-dimensional substrate can have a connector for electrically connecting the three-dimensional substrates which are spatially and continuously neighboring. Namely, the connector is electrically connected with the electronic component or another connector.

The three-dimensional substrate can hold the electronic component and the electric connection structure at an inside when the three-dimensional substrate is assembled, and the three-dimensional structure can be formed while the electronic component and the electric connection structure are visually blocked from an outside.

Furthermore, the present invention can provide an electronic device formed by three-dimensionally assembling at least one electronic component with a three-dimensional substrate for electrically connecting the electronic component with an outside.

The three-dimensional substrate can house the electronic component in a hollow internal area, or house the electronic component in a recessed portion formed at the three-dimensional substrate for housing the electronic component.

The inside of the electronic device is used as a circuit space and the electronic circuit itself is formed to be three-dimensional. Because of this, the electronic component can be connected vertically, laterally or obliquely in the electronic device. Thus, the capacity of the area for providing the electronic circuit can be enlarged. The electric component can be easily stacked on another electronic component and the wiring can be easily formed on the electronic component. Furthermore, the circuit is formed by being separated into a plurality of components. In addition, by mutually combining the components with each other so as to provide an electrical connection, the electronic devices having a complicated circuit and having an irregular shape such as a spherical shape can be provided. Since the substrate is not formed in a plate-like shape, the shape of the machine can be flexibly formed according to the demand of the design.

BRIEF DESCRIPTION OF THE DRAWINGS

FIG. 15 is a concept diagram of a three-dimensional substrate of the present invention.

DETAILED DESCRIPTION OF THE INVENTION

Figure 1:
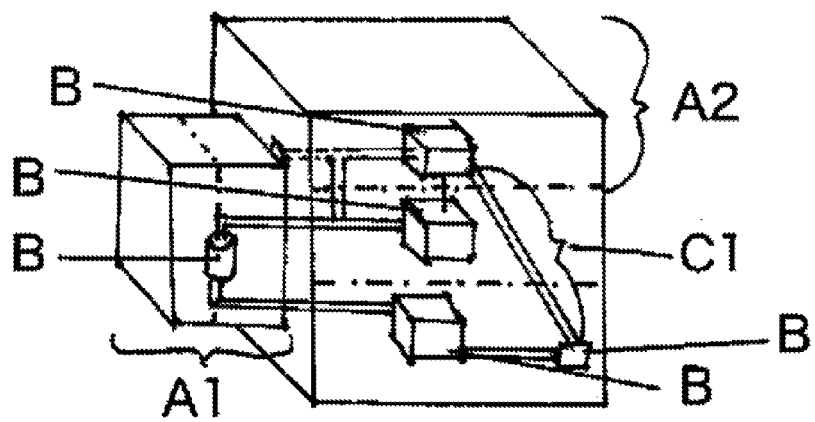
FIG. 1 is an explanatory drawing of a three-dimensional substrate and an electronic device of the present invention.

Hereafter, the present invention will be explained based on the embodiments. However, the present invention is not limited to the embodiments described below. In the explanation below, the three-dimensional substrate is formed so as to constitute a completed design when the assembling is finished. Namely, the three-dimensional substrate forms a three-dimensional structure by three-dimensionally constituting the cord. In addition, the three-dimensional substrate can be formed by combining a plurality of cords. Furthermore, a rigidity of the cord can be secured by forming the cord from an insulating material and a conductive material. The three-dimensional substrate is formed by using, for example, a computer graphics and considering a space as a substrate space. When the components are modeled by using the computer graphics, the components can be drawn by wire frames while the components are separated with a virtual line. The components drawn by the computer graphics are formed by a three-dimensional (3D) printer or a molding method using a metal mold, for example. The electrical components are mounted on the above described components and assembled to the original shape by using a connection member such as a connector. Thus, the electronic device having the same shape is actually completed.

Since the three-dimensional components are combined, the completed form necessarily becomes a three-dimensional substrate. Namely, the electronic device itself gives a three-dimensional shape. The three-dimensional shape can be given by an insulating material such as resins used for the three-dimensional printer, for example. The components designed by computer graphics and CAD can be directly formed and processed to the three-dimensional shape by forming the components by the three-dimensional printer.

The three-dimensional shape is separated into several components so that circuit elements such as an electronic component and other materials can be easily incorporated. As long as the rigidity of the components is secured, the components can be formed thinly or formed solidly. The components can form a recess and a hole in an inner space or inside the components so that electronic components, circuit components, connectors or the like are attached.

As another embodiment, the electronic components can be printed on a surface, or the electronic components can be assembled inside instead of fitting the components from outside. As explained above, by using the embodiments, the substrate can be integrated with the electronic components as a component having a three-dimensional shape. Thus, a circuit substrate itself can be eliminated. In addition, the substrate itself also serves as an exterior of the three-dimensional shape. Thus, work for separately designing an external case for the electronic device can be eliminated. Furthermore, since the shape of the three-dimensional components is determined by virtually separating the space and the actual product is assembled according to the determined shape. Thus, efficient manufacturing is enabled.

Hereafter, an electric connection structure used in the embodiments will be explained. In the embodiments, the connection structure for electrically connecting the components can be achieved by the following configuration. The connection structure is preferably formed from a component selected from the group consisting of:

(1) a conductive recessed portion and a conductive projected portion which are formed on the components facing each other;

(2) an opening to which a conductive material is inserted or injected;

(3) a joint surface to be conducted; and a combination of (1), (2) and/or (3).

The electronic component can be incorporated in each of the components. The electronic component is connected with the electric connection structure in the space formed in the components. Thus, as a whole, the electronic circuit is formed. In the final stage of assembling, a plurality of components can be fixed with each other to stable the three-dimensional shape. Thus, the electronic device can be formed.

The internal space can be obtained in the components by forming the components to have a thickness determined by considering the rigidity. Otherwise, the components can be solidly formed by an insulating material while remaining the space corresponding to the space for the electronic component so that the electronic component is embedded in and held by the components. In this case, since the shape of the electronic component is formed, work of embedding the electronic component can be simplified and automated. Furthermore, when compared with the conventional wiring substrate, sufficient material and space can be kept on the components in the present invention. Thus, the electronic component can be directly formed on the components.

As an exemplary embodiment, a circuit wiring of LED can be manufactured inside the components of a transparent acrylic resin or the like, for example. In this case, since the electronic component is embedded inside the components, holding strength can be improved. Thus, the electronic component can be stably built in. Furthermore, since the components themselves can also serve as an exterior, the exterior can be omitted and a substrate panel itself can be omitted.

In the present embodiment, virtual three-dimensional shape is created on the computer as a design drawing, the electronic components are assigned to each of the components, the components are designed by using computer graphics, and the shape is embodied by using a three-dimensional printer or the like. Then, the electronic components are actually mounted and the components are integrated by combining them like a three-dimensional jigsaw puzzle. The shape for constituting the three-dimensional substrate can be a simple shape like a puzzle piece or can be a complicated shape like an LED lighting device.

In the embodiments described below, the three-dimensional shape is shown as a cubic shape and the components are formed in a rectangular shape for the purpose of simplifying the explanation. The configuration of the three-dimensional substrate shown in FIG. 1 will be explained in detail. In FIG. 1, the three-dimensional shape is formed as a combination of two cubic shapes. On the CAD, the smaller cubic shape is designed as two cubic components extended in a vertical direction. The larger cubic shape is designed as three cubic components extended in a horizontal direction as shown as dashed-dotted lines in FIG. 1.

Figure 2:
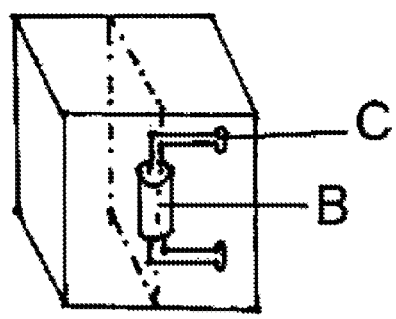
FIG. 2 is an enlarged view of A1 of FIG. 1.
Figure 3:
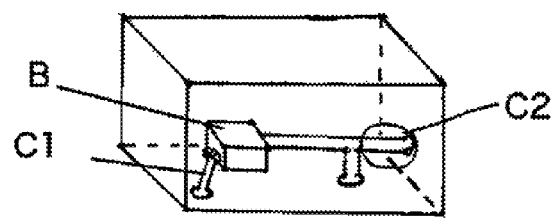
FIG. 3 is an enlarged view of A2 of FIG. 1.

As another embodiment, the portions of A1 and A2 shown in FIG. 1 can be configured as shown in FIG. 2 and FIG. 3. As shown in FIG. 2, a cubic shape A1 shown in FIG. 1 is separated from the center. The cubic shape A1 forms a recessed portion for embedding the electronic component and an aperture for adding the electric connection structure for connecting the circuit elements. After an electronic component B is embedded in the recessed portion, the components are assembled again. As a wiring C, if there are any wires attached to the electronic component B, the attached wires are used. If there is no attached wire, the wire is formed by a lead wire, plating or other methods.

As shown in FIG. 3, in a cubic shape A2, a recessed portions are formed on a surface of each separated component. Specifically, a recessed portion for fitting a chip (electronic component) B and an aperture C1 for the circuit are formed from both the lower surface and the lateral surface. In addition, a portion of C2 which is located at the lateral surface side is embedded and covered by an insulating material since the portion of C2 is unnecessary. Thus, the unnecessary recessed portion can be prevented from being exposed. The elements of the wiring can be formed by inserting a needle-like conductive material such as a lead wire from an opening. Alternatively, the elements of the wiring can be printed by plating. Alternatively, the elements of the wiring can be formed by injecting conducting material made from metal or alloy in accordance with the heat resistance of the insulating material.

Figure 4:
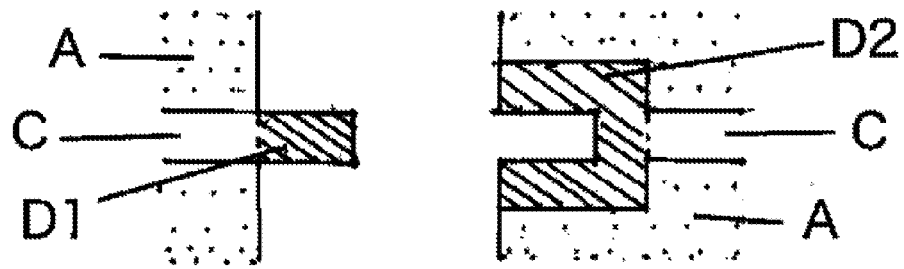
FIG. 4 is an embodiment of a fitting-type connector formed by pins and lands.
Figure 5:
FIG. 5 is an embodiment of a contact-type connector formed by pins and lands.

As shown as the portion C1 in FIG. 1, the wiring straddling the components can be achieved by forming the electric connection structure shown in FIG. 4 and FIG. 5 on the components. After the electrical connection is completed, the components are fixed. Thus, work of soldering can be significantly reduced. As another embodiment, after the components are fitted with each other, the components can be fixed by melt bonding, for example. For the melt bonding, a conductive material having a melting point lower than that of the substrate is used, and laser is irradiated from two external directions or heat is directly applied by a heat source to partially raise the temperature. In the present embodiment, the electronic components can be connected using the same method as the circuit. The three-dimensional substrate can be formed by using the three-dimensional printer or the like.

In addition, the holes formed inside the components can be machined according to the need of the circuit by using linear machining, lattice machining and radial machining, for example. Alternatively, the holes can be simultaneously formed by the three-dimensional printer when forming the shape. By assembling the components formed by the above described method, the electronic device having a three-dimensional shape and housing a complicated circuit can be formed.

FIG. 4, FIG. 5, FIG. 6 and FIG. 7 show connectors which are embodiments of the electric connection structure capable of being used in the present embodiment. The connector can be solidly formed. The connector is provided on an end portion of the cord. In the electric connection structure shown in FIG. 4, a conductive material C is embedded in an insulating material A and the conductive material C is protruded as a protrusion D1 from the first component located at the left side. The protrusion is fitted into a recessed portion D2 formed by a conductive material on the second component located at the right side. Thus, the first component and the second component are electrically connected.

In the connector shown in FIG. 5, a conductive material formed on the first component A located at the left side is extended to the lower part of the step of the first component to form a contact surface D. On the second component located at the right side, the step extended upward is formed, and another contact surface D made by a conductive material is formed to be arranged corresponding to the contact surface of the first component. Note that the conductive material forming the contact surfaces D are electrically connected with the conductive material extended inside the components. Thus, the first component and the second components can be electrically connected with each other. Note that the contact surfaces can be formed by a plating method, a conductive paste or a conductive adhesive, for example.

Figure 6:
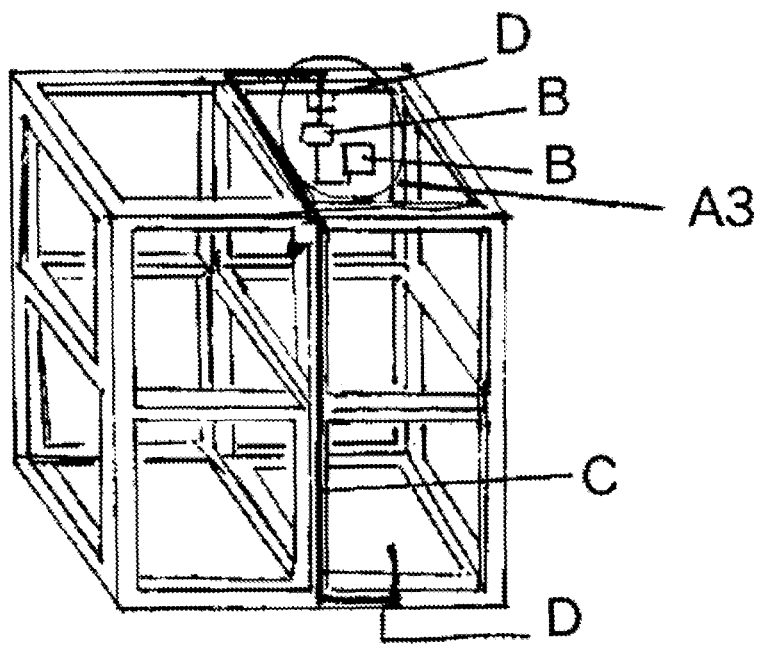
FIG. 6 is an embodiment of a three-dimensional substrate and an electronic device having a hollow inside and using a pipe-shaped framework.

The embodiment of the connector shown in FIG. 6 is an embodiment capable of being appropriately used when the three-dimensional shape is formed by long pillars, beams, pipes or the like so as to form wire frames. In the embodiment shown in FIG. 6, the wiring C made of a conductive material is embedded inside the pillars and the beams. The electronic component B is connected by an appropriate conductive material such as a lead wire. Note that the pillars and the beams can be connected with each other by using the electric connection structure explained in FIG. 4 and FIG. 5.

Figure 7:
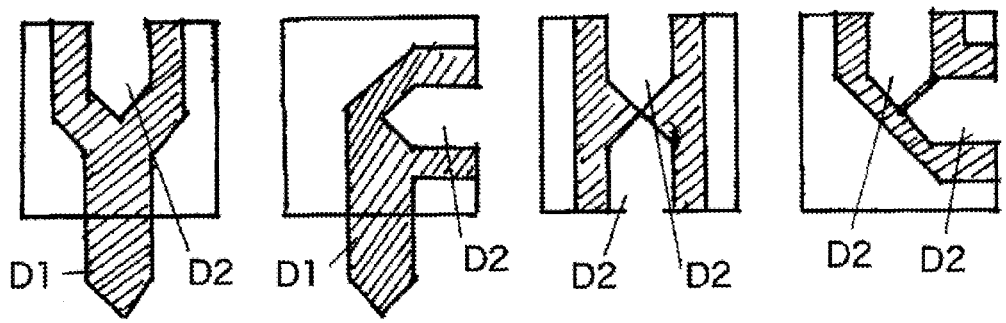
FIG. 7 is a cross-sectional view of an embodiment of a connector formed by hardening it around the wiring.
Figure 8:
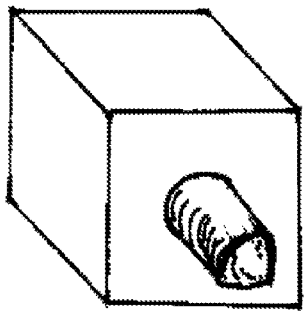
FIG. 8 is a perspective view of a connector shown as D1 in FIG. 7.

FIG. 7 shows a partial cross-sectional view of the component to which pins and lands are incorporated to function as the connector to mutually connect the components (circuits). In the components shown in FIG. 7, a protrusion portion D1 and a recessed portion D2 are formed on one component by a conductive material. The electrical connection can be provided by fixing the protrusion portion D1 and the recessed portion D2 between the other components since the shapes are formed to correspond with each other. FIG. 8 is a perspective view explaining the protrusion portion of the electric connection structure shown in FIG. 7.

The protrusion portion and the recessed portion of these components are stacked like bricks and connected with the electronic component B arranged inside the components to form the wiring. Thus, the completed design is formed. The process of assembling the components shown in FIG. 7 can be done by manual operation. However, the components can be precisely assembled by using a robot when the size is 1 mm or less. Note that the three-dimensional substrate of the present embodiment can be applied for the use of electronic products, education and hobby kits, for example. However, the use is not particularly limited.

Figure 9:
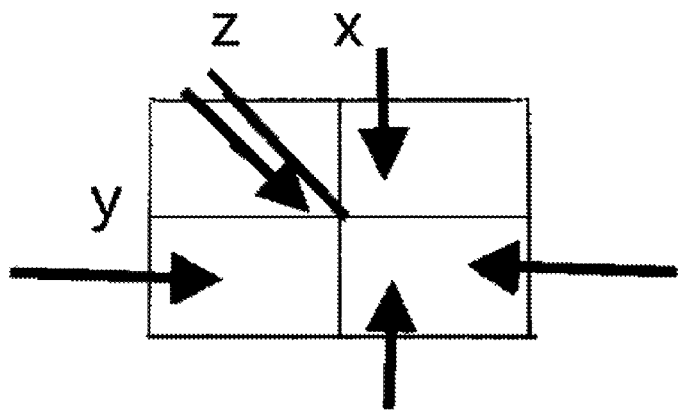
FIG. 9 is a conceptual diagram of a direction of assembling components.
Figure 10:
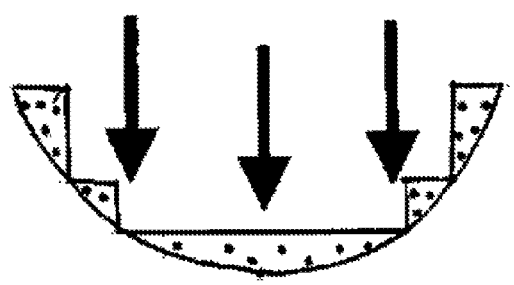
FIG. 10 is an embodiment of a base when assembling components.
Figure 11:
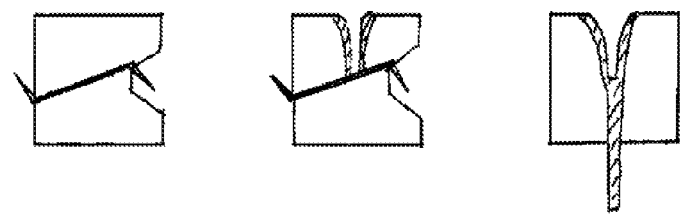
FIG. 11 is a conceptual diagram of a direction of assembling components from an upper direction.

FIG. 9 is a conceptual diagram explaining the assembling of the components of the present embodiment. When assembling the electronic components of the present embodiment, electronic components can be assembled from six directions of an X-axis direction, a Y-axis direction and a Z-axis direction as shown in FIG. 9. Alternatively, the electronic components can be inserted from an upper direction after a base is placed as shown in FIG. 10. The embodiment inserted from the upper direction is shown in FIG. 11. In the embodiment shown in FIG. 11, a hooking portion for engaging the other components is formed.

Figure 12:
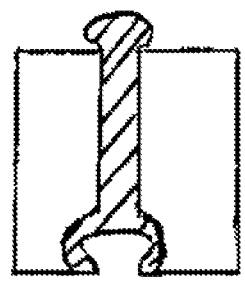
FIG. 12 is an embodiment of forming a hooking part for a fastener of a cubic wiring.

The embodiment shown in FIG. 12 can be also used for the wiring and the electric connection structure. In the embodiment shown in FIG. 12, the shape is a cubic shape. However, the cubic shape is merely an example. The components can be also formed as a block-shaped object having a thin-plate shape, a triangular shape, a hexagonal shape, an octagonal shape or an arbitrary curved structure.

In addition, the blocks having a hollow inside without having the wiring inside can be stacked to form a base and a conductive material can be inserted or injected into the hollow. In this embodiment, joint portions of the conductive material can be reduced. Thus, the electrical resistance can be reduced.

In addition, as shown in the base of FIG. 10, if the blocks without having the wiring structure are prepared and arranged between the components, hollow and space can be filled. Thus, integration property of the outer appearance can be increased. Namely, the block is arranged on the cord. On the contrary, when the space is required for the reason of thermal conductivity, the blocks forming only the framework can be used.

If the substrate panels are adhered and fixed with each other by using clips from the outside, combination like a puzzle, heat bonding, normal temperature curable adhesive agents, or adhesive putty for embedding the space, decomposition is normally difficult. Thus, the possibility of reverse analysis can be prevented.

Figure 13:
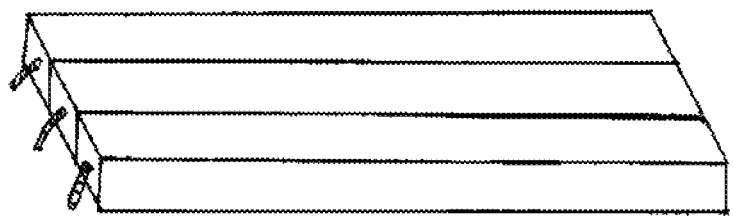
FIG. 13 is an embodiment of rectangular wiring cords.
Figure 14:
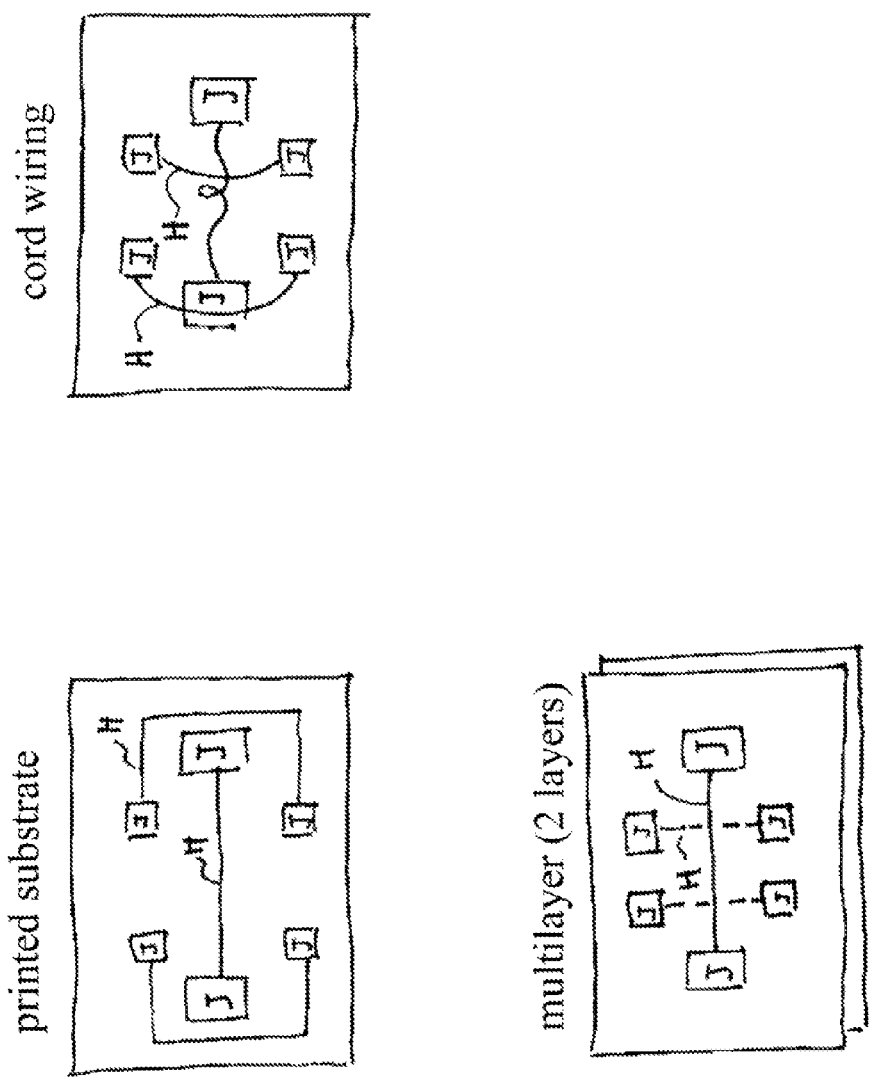
FIG. 14 is a concept diagram of a conventional wiring substrate.

FIG. 13 shows rectangular wiring cords having a square pole shape and a conductive material is inserted inside the square pole. The cords can be solidly formed. The rectangular wiring cords shown in FIG. 13 can provide a flat portion so that the electronic components can be easily stacked on the rectangular wiring cords. The electronic chips can be placed and fixed on the rectangular wiring cords. In addition, the electric connection structure between the components can be provided. Although the embodiment of FIG. 13 has a rectangular shape in cross-section in the drawing, the cross-sectional shape is not limited as long as the cords can fill the space without clearance. For example, the cross-sectional shape can be triangular, hexagonal or octagonal. In addition, the cord can be made by using the strong and bendable conductive material such as a wire. In this case, the shape of the wiring can be freely formed (e.g., the shape of a birdcage and a net). After the shape is formed, the wiring can be fixed to the components. Namely, the electronic component is fixed by the cord. In addition, the wiring (cords) can be connected with each other in an angle of 360° in a vertical direction and in an angle of 360° in a horizontal direction.

In another embodiment, hollow tubes using the insulating materials are connected by attaching or combining them to form the substrate, and then the conductive material is injected into the substrate. Thus, electric connection can be provided.

INDUSTRIAL APPLICABILITY

The inside of the electronic device is used as a circuit space and the electronic circuit itself is formed to be three-dimensional. Because of this, the electronic component can be connected vertically, laterally or obliquely in the electronic device. Thus, the capacity of the area for providing the electronic circuit can be enlarged. The electric component can be easily stacked on another electronic component and the wiring can be easily formed on the electronic component. Furthermore, the circuit is formed by being separated into a plurality of components. In addition, by mutually combining the components with each other so as to provide an electrical connection, the electronic devices having a complicated circuit and having an irregular shape such as a spherical shape can be provided. Since the substrate is not formed in a plate-like shape, the shape of the machine can be flexibly formed according to the demand of the design.

DESCRIPTION OF THE REFERENCE NUMERALS

A substrate
B electronic component
C wiring, circuit
D connector
H cord
J electronic component

What is claimed is:

1. A three-dimensional substrate for connecting at least one electronic component, the three-dimensional substrate comprising:
    a cord which is solidly formed; and
    a connector which is solidly formed, wherein
    the three-dimensional substrate forms a three-dimensional structure by three-dimensionally constituting the cord,
    the connector is electrically connected with the electronic component or another connector,
    the three-dimensional substrate is formed without using a printed substrate, and
    the connector is formed by pins and lands.

2. The three-dimensional substrate according to claim 1, wherein
    the three-dimensional substrate is formed by combining a plurality of cords.

3. The three-dimensional substrate according to claim 2, wherein
    the plurality of cords can be connected with each other in an angle of 360° in a vertical direction and in an angle of 360° in a horizontal direction.

4. The three-dimensional substrate according to claim 2, wherein
    the three-dimensional substrate is formed in a cubic shape by combining the plurality of cords.

5. The three-dimensional substrate according to claim 2, wherein
    the three-dimensional substrate has a hollow internal area for housing the electronic component.

6. The three-dimensional substrate according to claim 2, wherein
    the three-dimensional substrate has a recessed portion for housing the electronic component.

7. The three-dimensional substrate according to claim 1, wherein
the electronic component is fixed by the cord.

8. The three-dimensional substrate according to claim 1, wherein
a cross-sectional shape of the cord is one of rectangular, triangular, hexagonal and octagonal.

9. The three-dimensional substrate according to claim 1, wherein
the cord is bendable.

10. The three-dimensional substrate according to claim 1, wherein
a rigidity of the cord is secured by forming the cord from an insulating material and a conductive material.

11. The three-dimensional substrate according to claim 1, wherein
the cord is linearly formed.

12. The three-dimensional substrate according to claim 1, wherein
a cross-sectional shape of the connector is one of rectangular, triangular, hexagonal and octagonal.

13. The three-dimensional substrate according to claim 1, wherein
the connector can connect the cord and the electronic component in an X-axis direction, a Y-axis direction and a Z-axis direction.

14. The three-dimensional substrate according to claim 1, wherein
the connector is provided on an end portion of the cord.

15. A three-dimensional substrate for connecting at least one electronic component, the three-dimensional substrate comprising:
a cord which is solidly formed;
a connector which is solidly formed; and
a block without having a wiring structure, wherein
the three-dimensional substrate forms a three-dimensional structure by three-dimensionally constituting the cord,
the connector is electrically connected with the electronic component or another connector,
the three-dimensional substrate is formed without using a printed substrate, and
the block is arranged on the cord.

* * * * *